United States Patent
Yang et al.

(10) Patent No.: US 9,189,012 B2
(45) Date of Patent: Nov. 17, 2015

(54) CLOCK RECOVERY, RECEIVER, AND COMMUNICATION SYSTEM FOR MULTIPLE CHANNELS

(71) Applicants: Jaehyeok Yang, Daejeon (KR); Jinho Han, Daejeon (KR); Byungkuk Yoon, Daejeon (KR); Hyeonmin Bae, Seoul (KR); Jinho Park, Yongin (KR); Taeho Kim, Incheon (KR)

(72) Inventors: Jaehyeok Yang, Daejeon (KR); Jinho Han, Daejeon (KR); Byungkuk Yoon, Daejeon (KR); Hyeonmin Bae, Seoul (KR); Jinho Park, Yongin (KR); Taeho Kim, Incheon (KR)

(73) Assignee: Terasquare Co. Ltd., Seoul (KR)

( * ) Notice: Subject to any disclaimer, the term of this patent is extended or adjusted under 35 U.S.C. 154(b) by 385 days.

(21) Appl. No.: 13/829,566

(22) Filed: Mar. 14, 2013

(65) Prior Publication Data
US 2013/0262909 A1 Oct. 3, 2013

Related U.S. Application Data

(60) Provisional application No. 61/617,211, filed on Mar. 29, 2012.

(51) Int. Cl.
*G06F 1/04* (2006.01)
*G06F 11/00* (2006.01)
*G06F 1/08* (2006.01)
(Continued)

(52) U.S. Cl.
CPC ............... *G06F 1/08* (2013.01); *G06F 13/385* (2013.01); *G06F 13/405* (2013.01); *G06F 15/17* (2013.01); *G06F 17/30017* (2013.01); *H04L 7/0008* (2013.01); *H04L 7/0012* (2013.01); *H04L 25/14* (2013.01)

(58) Field of Classification Search
CPC ........... G06F 1/04; G06F 1/12; G06F 13/385; G06F 13/405; G06F 15/17; G06F 17/30017; H04L 1/0045; H04L 7/0008; H04L 7/0012; H04L 25/14
USPC ................... 713/500, 501, 502, 503, 400
See application file for complete search history.

(56) References Cited

U.S. PATENT DOCUMENTS

2009/0097606 A1 * 4/2009 Hutchins et al. .............. 375/376
2009/0257540 A1 10/2009 Tan
(Continued)

FOREIGN PATENT DOCUMENTS

EP 1469629 A1 10/2004
EP 1023793 B1 3/2012

OTHER PUBLICATIONS

International Search Report for corresponding application PCT/KR2013/002557, mailed Jul. 18, 2013 (3 pages).

*Primary Examiner* — Michael J Brown
(74) *Attorney, Agent, or Firm* — Finnegan, Henderson, Farabow, Garrett & Dunner LLP

(57) ABSTRACT

Disclosed are various exemplary embodiments of a clock recovery apparatus for recovering clock signals of multiple data channels. In one exemplary embodiment a clock recovery apparatus for a plurality of data channels may include a plurality of channel blocks, where each channel block may include a frequency detection block configured to generate an intermediate signal based on a respective data signal received from a respective data channel and a global signal, and a recovery block configured to recover a clock signal for the respective data channel in response to the respective data signal and the global signal. The apparatus may also include a global signal generation block configured to receive and combine the intermediate signals from the plurality of channel blocks to generate the global signal.

12 Claims, 10 Drawing Sheets

(51) Int. Cl.
*H04L 25/14* (2006.01)
*H04L 7/00* (2006.01)
*G06F 13/40* (2006.01)
*G06F 13/38* (2006.01)
*G06F 17/30* (2006.01)
*G06F 15/17* (2006.01)

(56) References Cited

U.S. PATENT DOCUMENTS

2011/0074483 A1 3/2011 Wang et al.
2011/0182330 A1 7/2011 Olson et al.

* cited by examiner

CLOCK RECOVERY, RECEIVER, AND COMMUNICATION SYSTEM FOR MULTIPLE CHANNELS

CROSS-REFERENCE TO RELATED APPLICATION

This application claims priority to U.S. Provisional Patent Application No. 61/617,211, filed on Mar. 29, 2012, which is incorporated herein by reference in its entirety.

TECHNICAL FIELD

Various embodiments of the present disclosure relate generally to digital data processing and, more particularly, to a clock recovery, a clock and data recovery (CDR), a receiver, and a communication system for multiple data channels.

DESCRIPTION OF RELATED ART

Unless otherwise expressly indicated herein, the materials described in this section are not necessarily prior art to the subject matter disclosed in this application and, therefore, should not be regarded as admitted prior art against the disclosures of the present application.

Clock recovery or clock and data recovery (CDR) techniques are used in various digital data processing, such as, for example, input/output (I/O) interfaces, receivers, and communication systems. For example, when a digital data stream is transmitted to a receiver without a clock signal, the receiver may use a CDR technique to generate a clock based on a proximate value of frequency reference. Finding the clock signal may enable the data to be recovered. However, some problems exist with traditional CDR techniques. For example, many CDR techniques require phase locking of a data stream in each channel. This may have the effect of subjugating the operation of rest of the streams to the locked data stream.

Parallel communication techniques have also been developed to transfer data using a plurality of data channels simultaneously in order to provide high speed transmission.

SUMMARY

Accordingly, there may exist a need for more efficient CDR techniques for multiple data streams.

To attain the advantages and in accordance with the purpose of the present disclosure, one aspect of the present disclosure may provide a clock recovery apparatus for a plurality of data channels. The apparatus may comprise a plurality of channel blocks, each channel block comprising a frequency detection block configured to generate an intermediate signal based on a respective data signal received from a respective data channel and a global signal, and a recovery block configured to recover a clock signal for the respective data channel in response to the respective data signal and the global signal. The apparatus may also include a global signal generation block configured to receive and combine the intermediate signals from the plurality of channel blocks to generate the global signal.

According to another exemplary aspect, the frequency detection block in each channel block may comprise a reference signal generator configured to generate a reference signal based on the respective data signal, a feedback signal generator configured to generate a feedback signal based on the global signal, and a frequency detector configured to generate the intermediate signal representing a frequency difference between the reference signal and the feedback signal.

In some exemplary aspects of the present disclosure, a clock recovery apparatus for a plurality of data channels may comprise a frequency acquisition block configured to receive data signals from a plurality of data channels and generate a global signal based on at least one data signal received from one or more active channels of the plurality of data channels, wherein the global signal has a frequency substantially the same as the frequency used by the one or more active channels. The apparatus may also comprise a plurality of recovery blocks corresponding respectively to the plurality of data channels, each of the plurality of recovery blocks being configured to recover a clock signal for a corresponding data signal by rotating the phase of the global signal based on the corresponding data signal.

Another exemplary aspect of the present disclosure may provide a receiver for a plurality of data channels. The receiver may comprise a plurality of channel blocks, each channel block comprising a frequency detection block configured to generate an intermediate signal in response to a respective data signal received from a respective data channel and a global signal, and a recovery block configured to recover a clock signal and data for the respective data channel in response to the respective data signal and the global signal. The receiver may also comprise a global signal generation block configured to receive and combine the intermediate signals from the channel blocks to generate the global signal. Some exemplary aspects may provide a communication system comprising the above-described receiver.

Some exemplary aspects may provide a method for clock recovery for a plurality of data channels. The method may comprise performing, at an apparatus comprising at least two channel blocks and a global signal generation block, generating, using a frequency detection block at each channel block, an intermediate signal based on a respective data signal received from a respective data channel and a global signal, recovering, using a recovery block each channel block, a clock signal for a respective data channel in response to the respective data signal and the global signal, and, at the global signal generation block, receiving and combining the intermediate signals from each channel block to generate the global signal.

One exemplary aspect of the present disclosure may also provide a tangible computer-readable medium containing instructions. The instructions may be configured to, when executed by an apparatus containing at least one processor, at least two channel blocks, and a global signal generation block, perform a method for clock recovery for a plurality of data channels. The method may comprise generating, using a frequency detection block at each channel block, an intermediate signal based on a respective data signal received from a respective data channel and a global signal, recovering, using a recovery block each channel block, a clock signal for a respective data channel in response to the respective data signal and the global signal, and receiving and combining, using the global signal generation block, the intermediate signals from each channel block to generate the global signal.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention, and, together with the description, serve to explain the principles of the invention.

DETAILED DESCRIPTION

Figure 1:
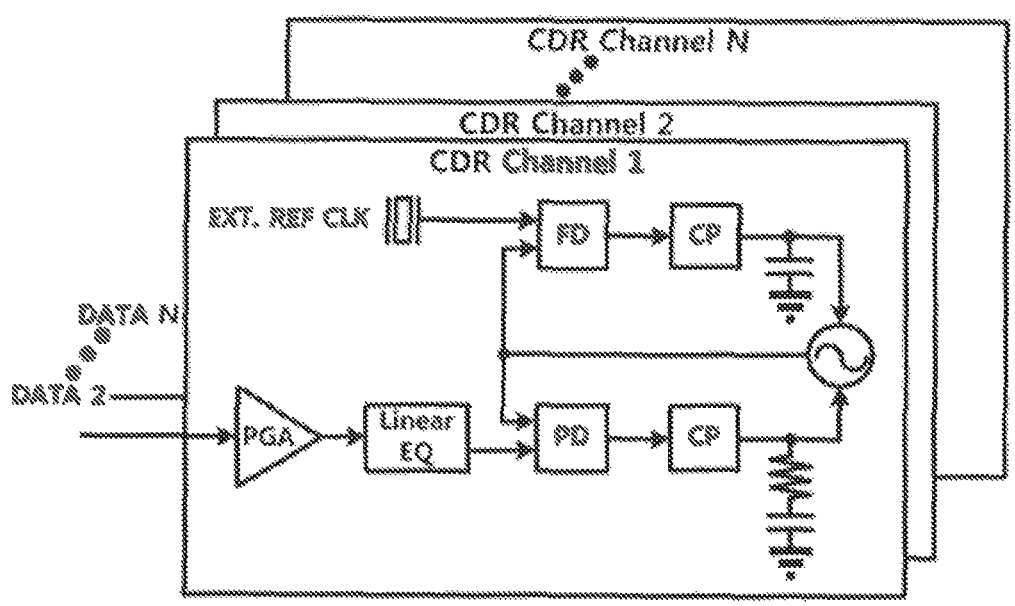
FIG. 1 shows an exemplary VCO-based CDR architecture.

In the following detailed description, reference is made to the accompanying drawings, which form a put hereof. Whenever possible, the same reference characters are used throughout the drawings to refer to the same or like parts, unless context dictates otherwise.

The disclosed technology may be applied to various systems, such as, for example, input/output (I/O) interfaces for computers, receivers, and communication systems. The disclosed embodiments will be mainly described hereinafter with respect to a clock recovery architecture. However, it will be apparent to those skilled in the art that the disclosed embodiments are not limited to this type of architecture.

FIG. 1 illustrates an exemplary voltage-controlled oscillator (VCO)-based CDR architecture, and HG. 2 illustrates an exemplary rotator-based CDR architecture.

Figure 2:
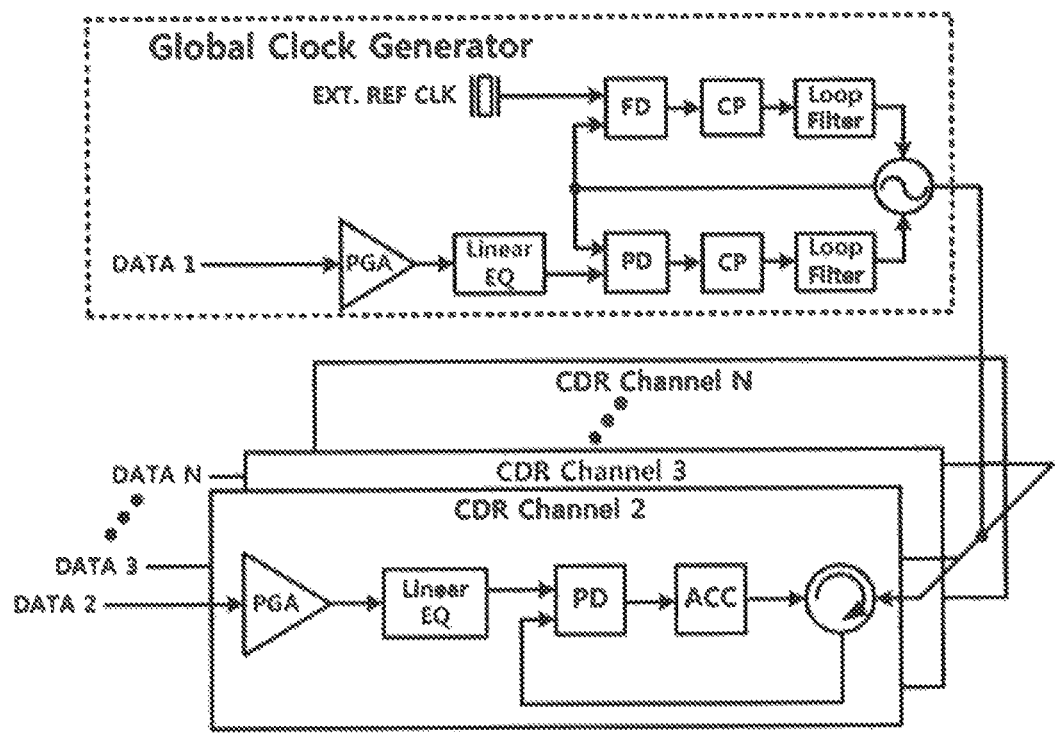
FIG. 2 shows an exemplary rotator-based CDR architecture.

Considering power usage and area efficiency, a rotator-based CDR architecture shown in FIG. 1 may be more suitable for parallel I/O applications than a VCO-based CDR architecture shown in FIG. 2. In case a reference clock signal is not present, a. VCO may need to be phase locked to a data stream in one of the channels (e.g., master channel), and the CDR operation for the rest of rotator-based channels may be subjugated to the presence of a phase-locked VCO clock signal.

Figure 3:
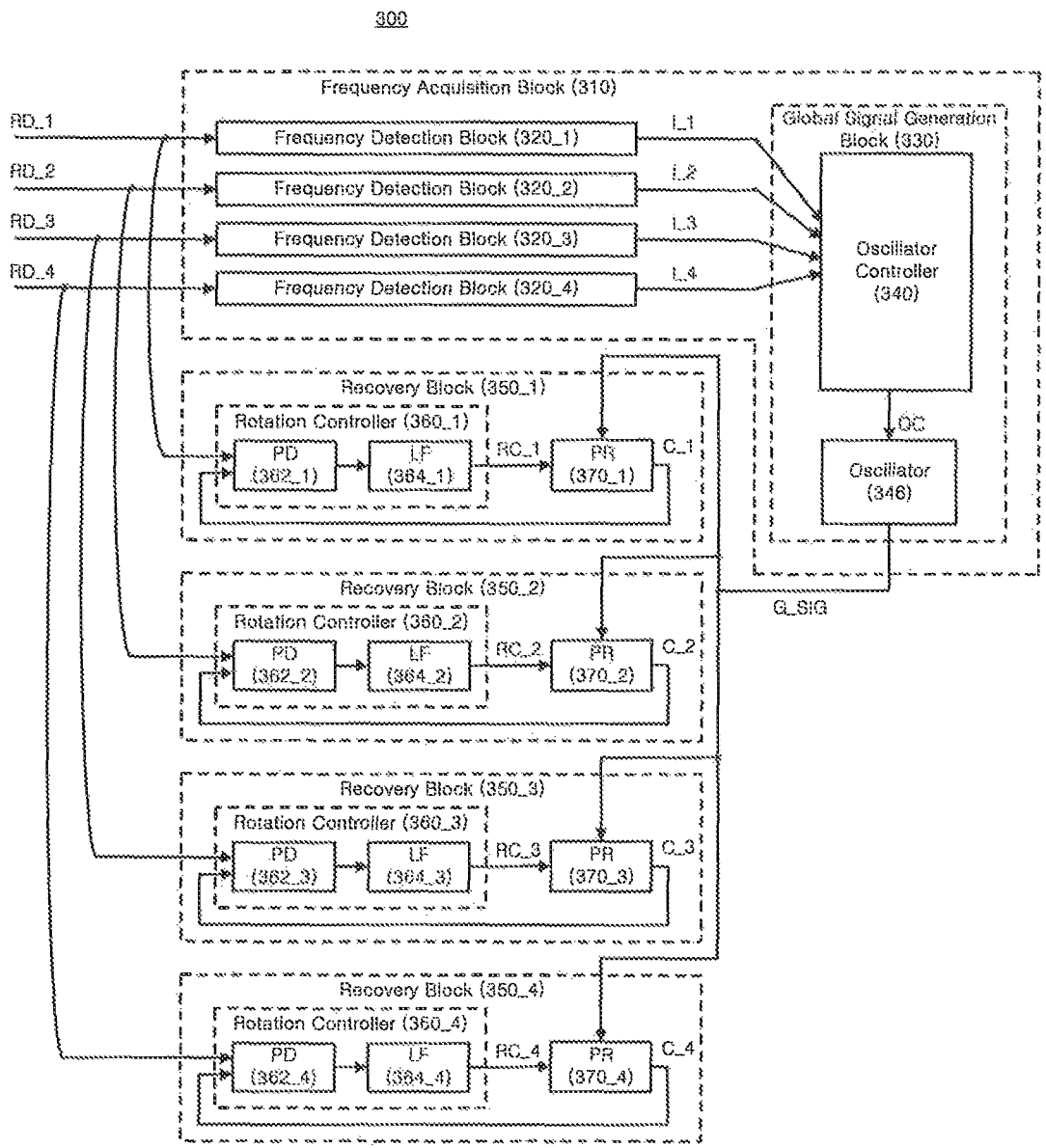
FIG. 3 shows a block diagram of an exemplary embodiment of a clock recovery apparatus, consistent with the present disclosure.

FIG. 3 shows a block diagram of an exemplary clock recovery apparatus 300, according to one exemplary embodiment. Clock recovery apparatus 300 may include a frequency acquisition block 310 and a plurality of recovery blocks 350$i$, 350_2, 350_3, and 350_4. Frequency acquisition block 310 may include a plurality of frequency detection blocks 320_1, 320_2, 320_3, and 320_4, each corresponding respectively to each data channel, and a global signal generation block 330.

The term "block," as used herein, may encompass a number of technologies for implementing the disclosed embodiments. For example, various "blocks" disclosed throughout the specification may represent an Integrated Circuit (IC), a Very Large Scale Integration-based chip (VLSI), an Application-Specific Integrated Circuit (ASIC), or any hardware, firmware, software, or combination thereof.

As shown in FIG. 3, frequency acquisition block 310 may be configured to receive data signals RD_1, RD_2, RD_3, and RD_4 from a plurality of data channels and generate a global signal G_SIG based on at least one of data signals RD_1, RD_2, RD_3, and RD_4 received from one or more active data channels. For example, each of the plurality of frequency detection blocks 320_1, 320_2, 320_3, and 320_4 may be configured to process a corresponding data signal RD_1, RD_2, RD_3, or RD_4 to generate an intermediate signal I_1, I_2, L'3, or I_4, and global signal generation block 330 may be configured to combine intermediate signals I_1, I_2, I_3, and I_4 to generate global signal G_SIG. The active data channels may include channels from which valid data signals, such as non-return-to-zero (NRZ) signals, are received. Global signal G_SIG may have a frequency substantially the same as the frequency used by the one or more active channels.

Global signal generation block 330 may include an oscillator controller 340 and an oscillator 346. Oscillator controller 340 may be configured to combine intermediate signals I_1, I_2, I_3, and I_4 to generate an oscillator control signal OC. Oscillator 346 may be configured to generate global clock signal G_SIG based on oscillator control signal OC. In some exemplary embodiments, oscillator 346 may be configured to generate global clock signal G_SIG having a frequency that is determined by oscillator control signal OC.

The plurality of recovery blocks 350_1, 350_2, 350_3, and 350_4, each corresponding respectively to each of the plurality of data channels, may be configured to recover clock signals C_1, C_2, C_3, and C_4 for the corresponding data channels based on respective data signals RD_1, RD_2, RD_3, and RD_4 received from the corresponding data channels and global signal G_SIG generated from frequency acquisition block 310.

Each of recovery blocks 350_1, 350_2, 350_3, and 350_4 may include a rotation controller 360_1, 360_2, 360_3, or 360_4 and a phase rotator 370_1, 370_2, 370_3, or 370_4. Rotation controller 360_1, 360_2, 360_3, or 360_4 may be configured to generate a rotation control signal RC_1, RC_2, RC_3, or RC_4 based on a corresponding clock signal C_1, C_2, C_3, C_4 and a corresponding data signal RD_1, RD_2, RD_3, or RD_4.

For example, rotation controller 360_1, 360_2, 360_3, or 360_4 may include a phase detector 362_1, 362_2, 362_3, or 362_4 and a loop filter 364_1, 364_2, 364_3, or 364_4. Phase detector 362_1, 362_2, 362_3, or 362_4 may be configured to generate a signal representing a phase difference between the corresponding clock signal C_1, C_2, C_3, or C_4 and data signal RD_1, RD_3, or RD_4. Loop filter 364_1, 364_2, 354_3, and 364_4 may be configured to filter the output of a respective phase detector 362_1, 362_2, 362_3, or 362_4 to generate rotation control signal RC_1, RC_2, RC_3, or RC_4.

Phase rotator 370_1, 370_2, 370_3, or 370_4 may be configured to rotate the phase of global signal G_SIG according to rotation control signal RC_1, RC_2, RC_3, or RC_4 generated from the corresponding rotation controller 360_1, 360_2, 360_3, or 360_4 to generate clock signal C_1, C_2, C_3, or C_4.

Figure 4:
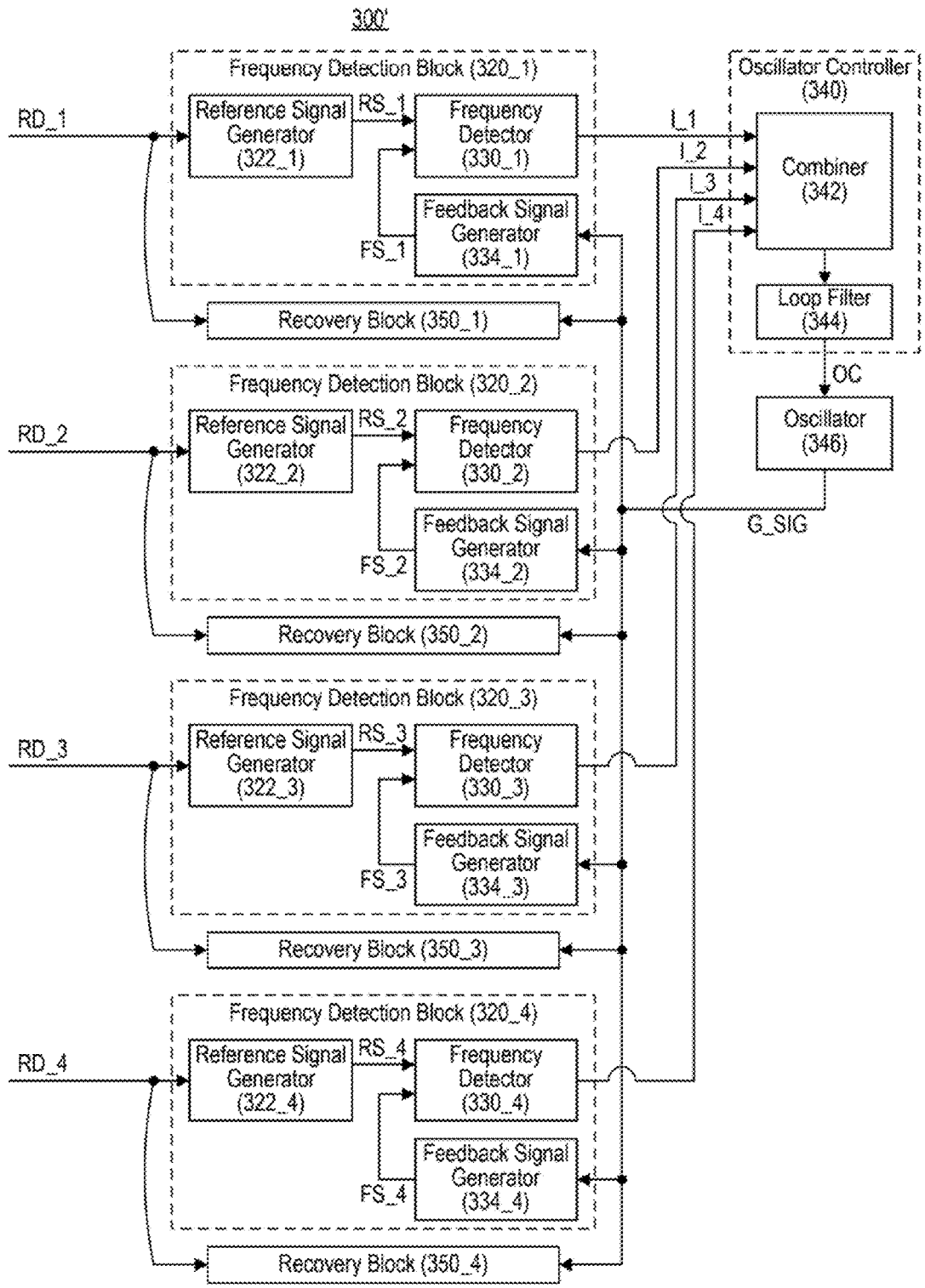
FIG. 4 shows a block diagram of another exemplary embodiment of a clock recovery apparatus, consistent with the present disclosure.

FIG. 4 shows a block diagram of another exemplary embodiment of a clock recovery apparatus 300', consistent with the present disclosure. Clock recovery apparatus 300' may include a plurality of frequency detection blocks 320_1, 320_2, 320_3, and 320_4, a plurality of recovery blocks 350_1, 350_2, 350_3, and 350_4, a oscillator controller 340, and an oscillator 346.

Each frequency detection block 320_1, 320_2, 320_3, or 320_4 may include a reference signal generator 322_1, 322_2, 322_3, or 322_4, a feedback signal generator 334_1, 334_2, 334_3, or 334_4, and a frequency detector 330_1, 330_2, 330_3, or 330_4.

Reference signal generator 322_1, 322_2, 322_3, or 322_4 may be configured to generate a reference signal RS_1, RS_2, RS_3, or RS_4 based on a corresponding data signal RD_1, RD_2, RD_3, or RD_4. In one exemplary embodiment, reference signal generator 322_1, 322_2, 322_3, or 322_4 may be configured to divide the frequency of corresponding data signal RD_1, RD_2, RD_3, or RD_4 with a first division ratio to generate reference signal RS_1, RS_2, RS_3, or RS_4. By way of example only, this division ratio may be 512.

Feedback signal generator 334_1, 334_2, 334_3, or 334_4 may generate a feedback signal FS_1, FS_2, FS_3, or FS_4 based on global signal G_SIG generated from oscillator 346. For example, feedback signal generator 334_1, 334_2, 334_3, and 334_4 may be a frequency divider configured to divide the frequency of global clock signal G_SIG with a second division ratio to generate feedback signal FS_1, FS_2, FS_3, or FS_4. By way of example only, this division ratio may be 512.

In one exemplary embodiment, oscillator controller 340 may include a combiner 342 and a loop filter 344. Combiner 342 may be configured to combine intermediate signals I_1, I_2, I_3, and I_4 received from the plurality of frequency detection blocks 320_1, 320_2, 320_3, and 320_4. Loop filter 344 may be configured to filter the output of combiner 342 to generate oscillator control signal OC. In an alternative embodiment, loop filter 344 may be positioned between each frequency detector 330_1, 330_2, 330_3, or 330_4 and combiner 342.

Figure 5:
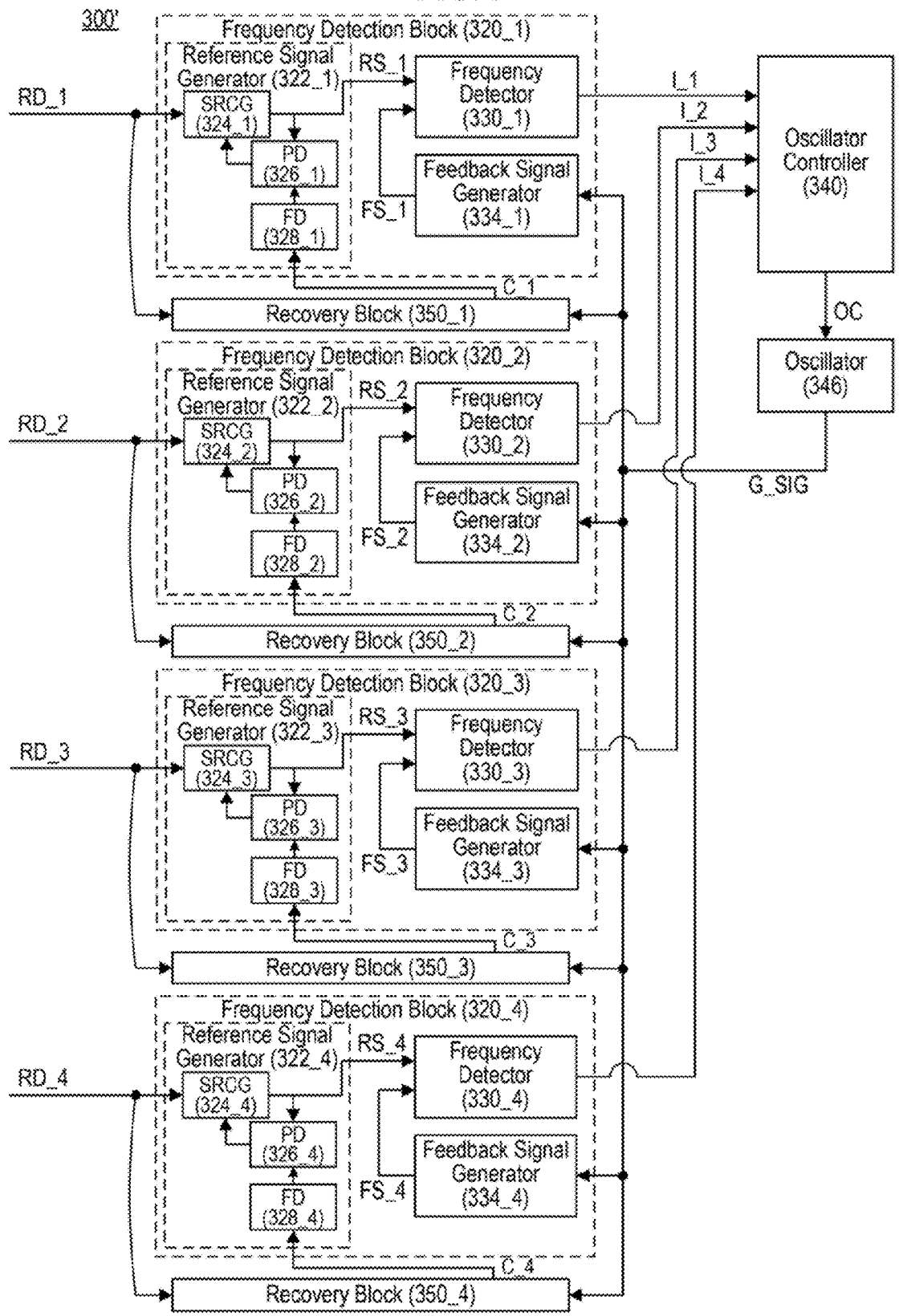
FIG. 5 shows a block diagram of another exemplary embodiment of a clock recovery apparatus, consistent with the present disclosure.

FIG. 5 shows a block diagram of another exemplary embodiment of a clock recovery apparatus 300", consistent with the present disclosure.

Clock recovery apparatus 300" may include a plurality of frequency detection blocks 320_1, 320_2, 320_3, and 320_4, a plurality of recovery blocks 350i, 350_2, 350_3, and 350_4, an oscillator controller 340, and an oscillator 346.

Each of frequency detection blocks 320_1, 320_2, 320_3, and 320_4 may be configured to generate an intermediate signal I_1, I_2, I_3, or I_4 based on a corresponding data signal RD_1, RD_3, or RD_4, global clock signal G_SIG, and clock signal C_2, C_3, or C_4. Reference signal generator 322_1, 322_2, 322_3, or 322_4 may be configured to divide the frequency of a corresponding data signal RD_1, RD_2, RD_3, or RD_4 with a first division ratio based on clock signal C_1, C_2, C_3, or C_4. Feedback signal generator 334_1, 334_2, 334_3, or 334_4 may be configured to divide the frequency of global clock signal G_SIG with a second division ratio.

Reference signal generator 322_1, 322_2, 322_3, or 322_4 may include a respective stochastic reference clock generator (SRCG) 324_1, 324_2, 324_3, or 324_4, a phase detector 326_1, 326_2, 326_3, or 326_4, and a frequency divider 328_1, 328_2, 328_3, or 328_4, SRCG 324_1, 324_2, 324_3, or 324_4 may be configured to divide corresponding data signal RD_1, RD_2, RD_3, RD_4 with the first division ratio controlled based on the output of a respective phase detector 326_1, 326_2, 326_3, or 326_4, such as a bang-bang phase detector.

Figure 6:
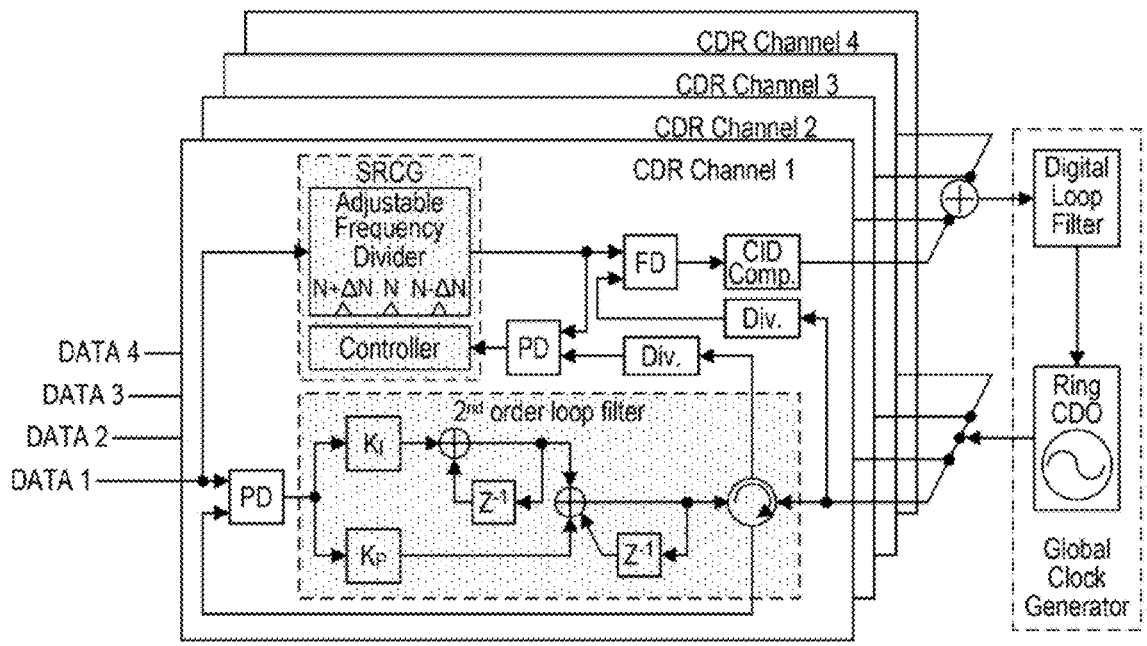
FIG. 6 shows an exemplary master-less and reference-less rotator-based parallel CDR architecture, consistent with the present disclosure.

FIG. 6 shows a master-less and reference-less rotator-based parallel CDR architecture, consistent with the present, disclosure. In some exemplary embodiments, each channel block may contain a stochastic reference clock generator (SRCG), a CID tolerant counter-based frequency detector (FD), and a jitter suppression loop. The SRCG may create a quasi-periodic signal through the division of random input data, which may be a data signal. The outputs of the FD in each channel block may be combined and accumulated in the digital domain for controlling a global VCO. Thus, the VCO can be frequency-locked, provided that an input signal is present in any one of the data channels which endows a master-less and reference-less operation. Entire data channels may operate independently without requiring a master channel while achieving low power and area overhead.

Figure 7:
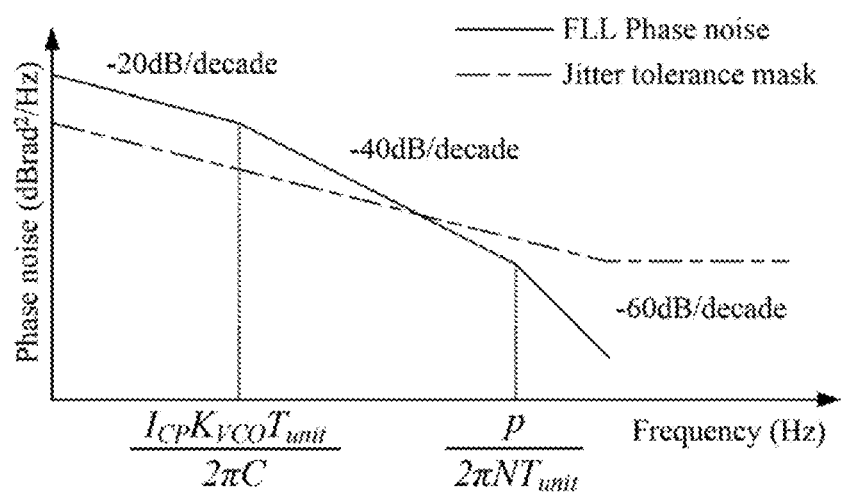
FIG. 7 shows comparison between jitter tolerance mask and the phase noise of the FLL, consistent with the present disclosure.

FIG. 7 shows comparison between jitter tolerance mask and the phase noise of the FLL, consistent with the present disclosure. Unlike conventional dual loop PLLs, where frequency-locked loops (FLLs) operate at startup only, the disclosed FLL may operate continuously. A SRCG-based frequency acquisition scheme may consume significantly less power compared to conventional designs since the SRCG may require a single line rate D flip-flop and the entire remaining blocks operate at divided rates. However, large accumulated jitter from the SRCG may degrade the quality of the VCO clock signal and eventually increase the bit-error-rate (BER) penalty in each data channel. Thus, in some exemplary embodiments, an additional jitter suppression loop with an adjustable frequency divider may be employed in each channel to counter-balance any accumulated jitter caused by the SRCG and suppress the jitter from the VCO.

The VCO signal frequency locked to the SRCG may be distributed to each CDR channel, and the phase rotator may be controlled to minimize the phase difference between the input data signal and the clock signal. The accumulation jitter of the SRCG is unbounded and may increase with a slope of 20 dB/decade as frequency decreases. High frequency phase noise of the SRCG may be mostly filtered out by the FLL, whereas low frequency phase noise may be hardly affected by the FLL and can exceed the maximum tolerable jitter of a CDR in each channel.

Figure 8:
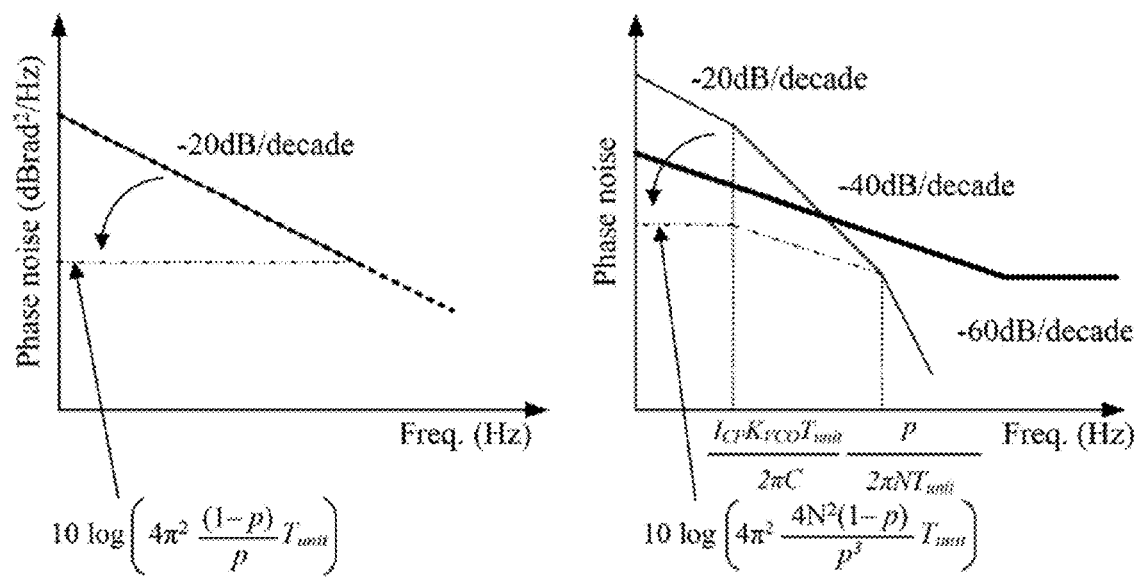
FIG. 8 shows the change of the phase noise of the SRCG and FLL when jitter accumulation is removed, consistent with the present disclosure.

FIG. 8 shows an expected change of the FLL phase noise when the accumulation jitter of the SRCG is eliminated. Large low frequency phase noise of the SRCG can be reduced by preventing the accumulation of its period jitter. In order to suppress the jitter accumulation in the SRCG, the instantaneous phase of the SRCG may be compared with that of a reference clock signal. The division ratio in the SRCG may then be adjusted dynamically. Such variable frequency division concept may be commonly employed in frequency synthesizers. In case the clock edge of the SRCG output is lagging the target edge, the division ratio of the SRCG may be reduced to shorten the period of the subsequent. SRCG output. On the contrary, the division ratio may be increased in case the clock edge of the SRCG leads the target edge. A bang-bang phase detector may be utilized to control the division ratio of the SRCG. The amount of variable division ratio chosen to balance jitter accumulation and the self jitter generation of the SRCG.

Figure 9:
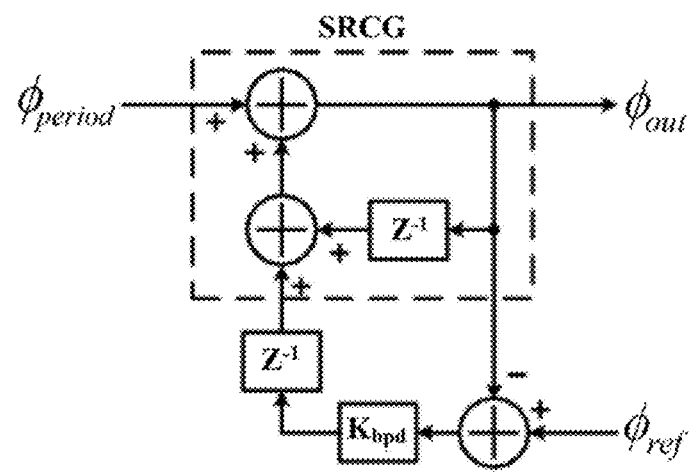
FIG. 9 shows the mathematical model of jitter suppression loop, consistent with the present disclosure.

FIG. 9 shows a conceptual block diagram for modeling the accumulation jitter and the jitter suppression loop, consistent with the present disclosure. The accumulation jitter may be modeled by a random walk process, and an adjustable frequency divider may be represented as a phase domain addition. The output jitter of the loop may be given by $$\phi_{out} = \frac{1}{1+(K_{bpd}-p)z^{-p}}\phi_{period} + \frac{K_{bpd}z^{-p}}{1+(K_{bpd}-p)z^{-p}}\phi_{ref},$$

where $\phi_{period}$, $\phi_{ref}$, and $\phi_{out}$ denote the period jitter of the SRCG, reference clock jitter, and the output jitter, respectively, and $K_{bpd}$ is the linearized gain of BBPD. By taking the bi-linear transformation of this equation for simplicity, the output jitter may be represented as $$\phi_{out} = \frac{s+\frac{2}{T_0}}{(2-K_{bpd})s+\frac{2}{T_0}K_{bpd}}\phi_{period} + \frac{K_{bpd}\left(\frac{2}{T_0}-p\right)}{(2-K_{bpd})s+\frac{2}{T_0}K_{bpd}}\phi_{ref}$$

Provided that the reference clock is jitter free and $\phi_{ref}=0$, the above transfer function may be simplified as $$\frac{\phi_{out}}{\phi_{period}} = \frac{s+\frac{2}{T_0}}{(2-K_{bpd})s+\frac{2}{T_0}K_{bpd}}.$$

The DC gain of the loop is $$\frac{1}{K_{bpd}},$$

and pole aria zero are located at $$\frac{2K_{bpd}}{(2-K_{bpd})T_0} \text{ and } \frac{T_0}{2},$$

respectively. In case $K_{bpd}$ is less than 1, jitter accumulates at the output and the low frequency output phase noise is greater than that at the input. The accumulated jitter can be optimally removed when $K_{bpd}=1$, which can be achieved by setting the variation in the division ratio, $\Delta N$, identical to the average period jitter of the SRCG.

The mean and variance of the time difference between two adjacent transition edges of the SRCG is given by $$\mu = \frac{N}{p}T_{unit}$$

$$\sigma^2 = \frac{N(1-p)}{p^2}T_{unit}^2,$$

where N is the division ratio, p is the transition density, and $T_{unit}$ is the unit interval.

The mean and variance of one period are $2\mu$ and $2\sigma^N$, respectively. In case the division ratio changes by $\Delta N$, a dock period changes by $$2\frac{\Delta N}{p}T_{unit}.$$

By equating the variation of the period from $\Delta N$ with the standard deviation of the period jitter, $$2\frac{\Delta N}{p}T_{unit} = \sqrt{2\frac{N(1-p)}{p^2}T_{unit}^2},$$

the period $\Delta N$ becomes $$\Delta N = \sqrt{\frac{N(1-p)}{2}},$$

Figure 10:
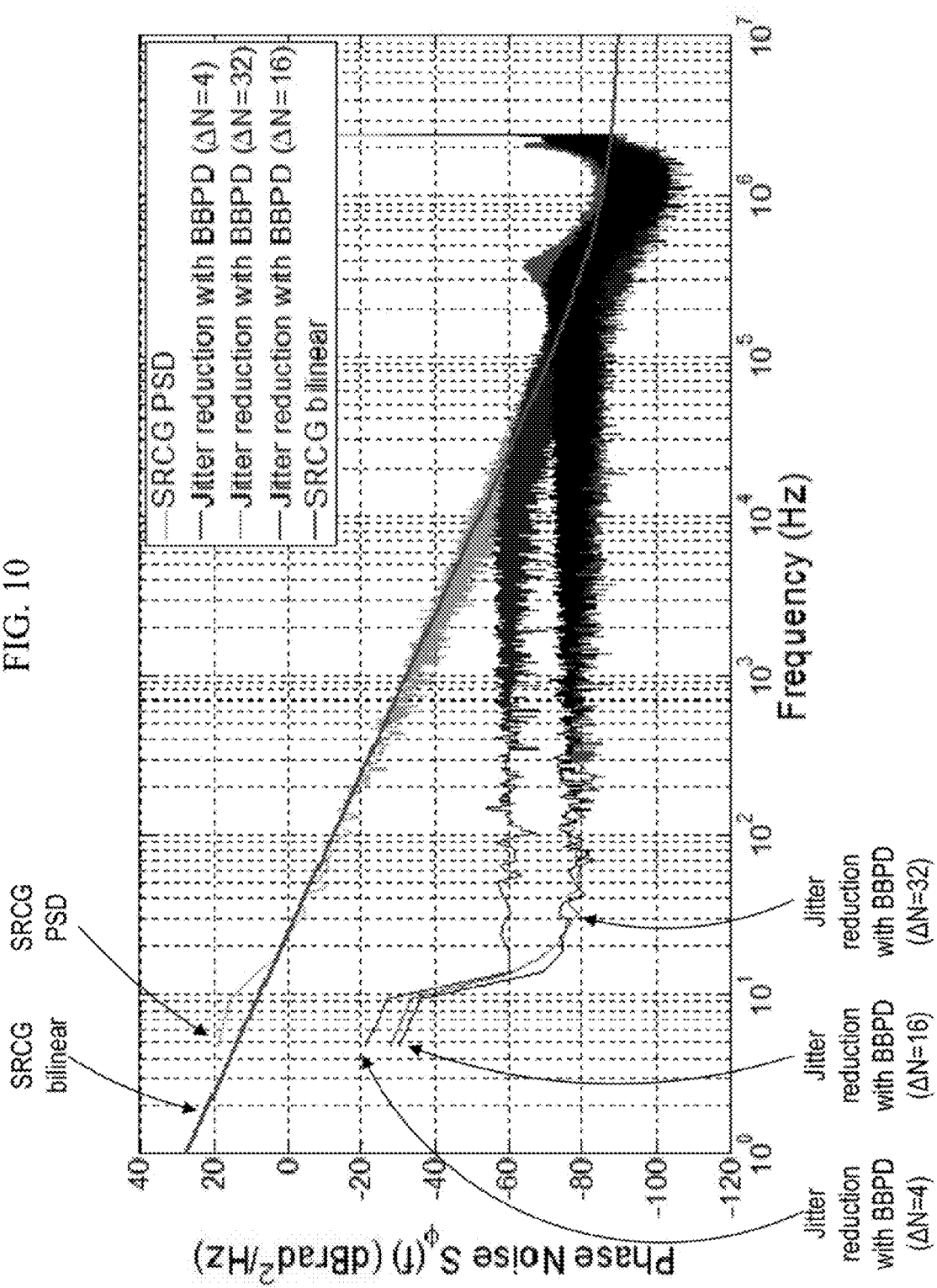
FIG. 10 shows the behavioral simulation result of the phase noise of the SRCG with jitter suppression scheme, consistent with the present disclosure.

FIG. 10 shows a result of behavioral simulation for the phase noise of the SRCG when p=0.5 and N=1024. The optimal $\Delta N$ is 16 in this case. It should be understood that other values are possible for $\Delta N$ as well.

The output of the phase rotator may be used as a reference clock in the jitter suppression loop. Because the FLL-filtered SRCG signal is high-pass filtered by the rotator loop, output clock of the rotator may have lower low frequency phase noise than that of the FLL. The reduction of the accumulated jitter of the SRCG suppresses the low frequency phase noise of the FLL and eventually makes the rotator output clock even cleaner. Such a bootstrapping action reduces the phase noise of both FLL and PLL gradually. Simulated phase noise of the SRCG and the FLL with and without the jitter suppression loop clearly shows the effectiveness of the proposed scheme.

The exemplary embodiments illustrated above may be applied to various receivers including devices for optical, wired, or wireless communication. The device may include network equipment, personal devices, computers, and modules, such as bus interfaces in computers.

Figure 11:
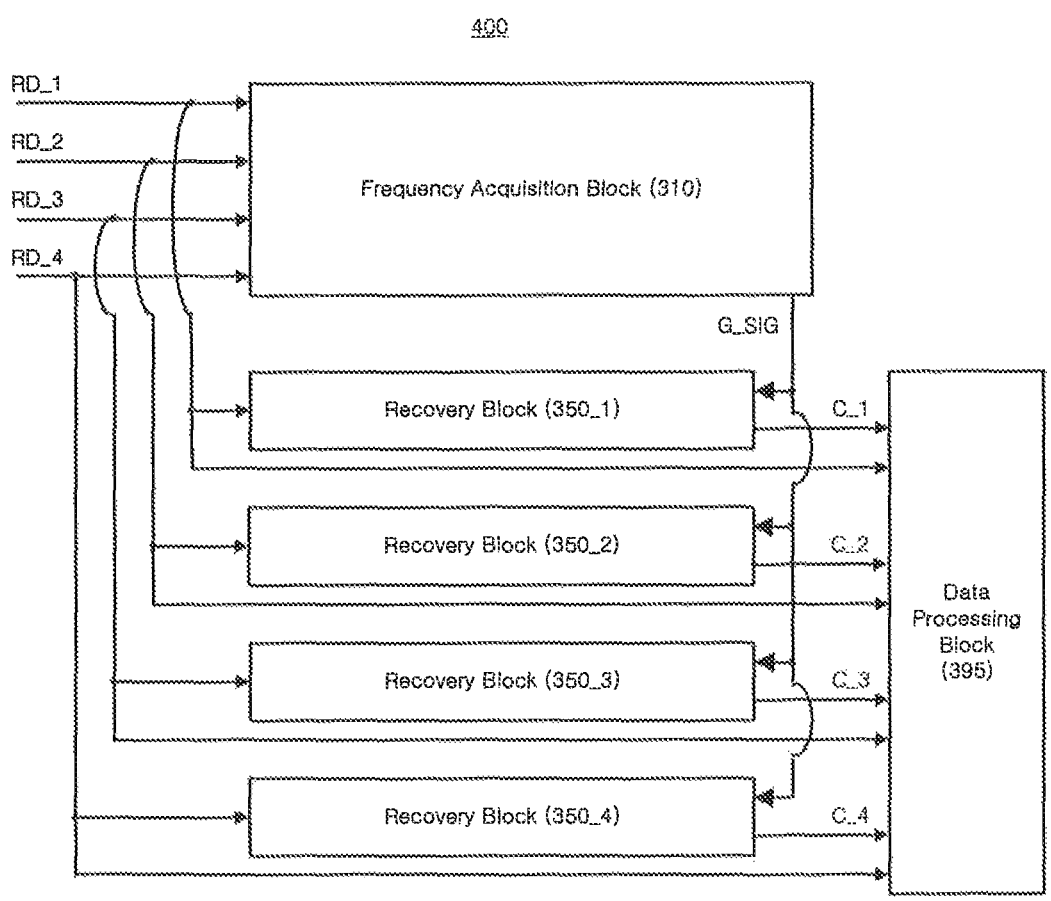
FIG. 11 shows a block diagram of an exemplary embodiment of a receiver, consistent with the present disclosure.

FIG. 11 shows a block diagram of an exemplary embodiment of a receiver 400, consistent with the present disclosure. Receiver 400 may include frequency acquisition block 310 and a plurality of recovery blocks 350_1, 350_2, 350_3, and 350_4. Receiver 400 may further include data processing block 395.

Data processing block 395 may be configured to recover data based on data signals RD_1, RD_2, RD_3, and RD_4 and the recovered clock signal RD_1, RD_3, and RD_4. For example, data processing block 395 may apply hard or soft decisions to data signals RD_1, RD_2, RD_3, and RD_4 with recovered clock signal RD_1, RD_2, RD_3, and RD_4 to generate the recovered data. Data processing block 395 may be configured to apply further processing to the recovered data. The processing may include various processing dedicated to the various receivers illustrated above.

Figure 12:
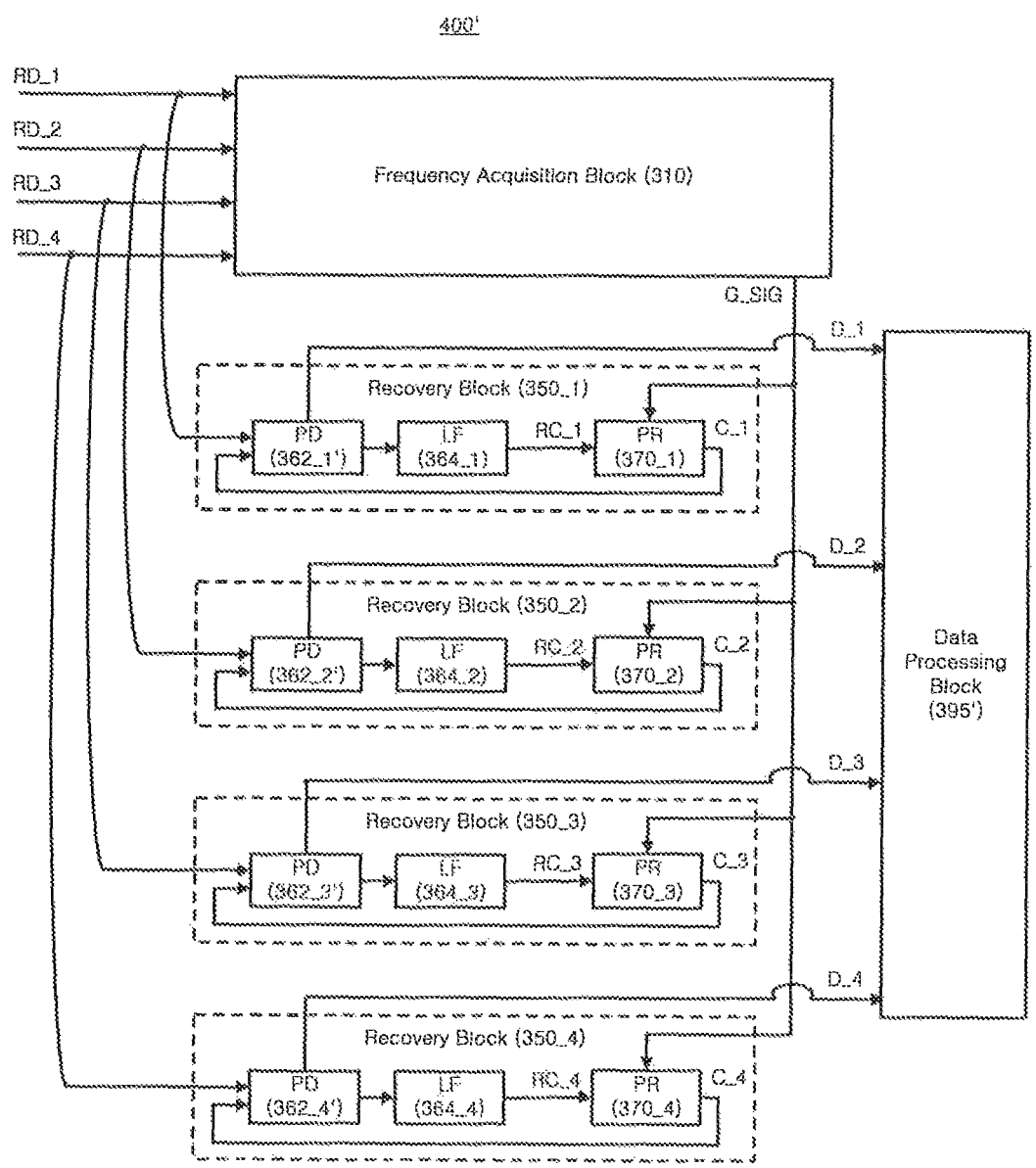
FIG. 12 shows a block diagram of another exemplary embodiment of a receiver, consistent with the present disclosure.

FIG. 12 shows a block diagram of another exemplary embodiment of a receiver 400', consistent with the present disclosure. Receiver 400' may include a frequency acquisition block 310 and a plurality of recovery blocks 350_1, 350_2, 350_3, and 350_4. Phase detectors 362_1', 362_2', 362_3', and 362_4' included in each of the plurality of recovery blocks 350_1, 350_2, 350_3 and 350_4 may be configured to perform data recovery as well as phase detection in the manner similar to those illustrated above. For example, each phase detector 362_3, 362_2', 362_3', or 362_4' may be configured to apply soft or hard decisions to each data signal RD_1, RD_2, RD_3, or RD_4 with each of the recovered clocks C_1, C_2, C_3, or C_4 to recover data D_1, D_2, D_3, D_4.

Data processing block 395' may be configured to apply further processing to the recovered data. For example, data processing block 395' may be further configured to process the recovered data as described above with respect to the various types of receiver devices.

Various embodiments of the receiver illustrated above may be applied to various communication systems, including communication systems in which remote transmitter and receiver perform optical, wired, or wireless communication and inter module communication in which modules in a device (e.g., computer) perform communication using a medium in the device such as bus interface.

In the exemplary embodiments disclosed above, any of the operations, processes, and steps can be implemented as computer-readable instructions stored on a tangible computer-readable medium. The computer-readable instructions can be executed by a processor of a mobile unit, a network element, and/or any other computing device.

The foregoing detailed description has set forth various embodiments of the devices and/or processes via the use of block diagrams and examples. Insofar as the block diagrams and examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as any combination thereof, and that designing the circuitry and/or writing the code for the hardware, software, and/or firmware would be well within the skill of one of skill in the art in light of this disclosure.

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled.

What is claimed is:

1. A clock recovery apparatus for a plurality of data channels, the apparatus comprising:
a plurality of channel blocks, each channel block comprising:
a frequency detection block configured to generate an intermediate signal based on a respective data signal received from a respective data channel and a global signal; and
a recovery block configured to recover a clock signal for the respective data channel in response to the respective data signal and the global signal; and
a global signal generation block configured to receive and combine the intermediate signals from the plurality of channel blocks to generate the global signal,
wherein the frequency detection block in each channel block comprises:
a reference signal generator configured to generate a reference signal based on the respective data signal;
a feedback signal generator configured to generate a feedback signal based on the global signal; and
a frequency detector configured to generate the intermediate signal representing a frequency difference between the reference signal and the feedback signal.

2. The apparatus of claim 1, wherein:
the reference signal generator in each channel block is configured to divide the frequency of the respective data signal to generate the reference signal, and
the feedback signal generator in each channel block comprises a frequency divider for dividing the frequency of the global clock signal to generate the feedback signal.

3. The apparatus of claim 1, wherein the global signal generation block comprises:
an oscillator controller configured to combine the intermediate signals to generate an oscillator control signal; and
an oscillator configured to generate the global clock signal based on the oscillator control signal.

4. The apparatus of claim 3, wherein the oscillator controller comprises:
a combiner configured to combine the intermediate signals; and a filter configured to filter the output of the combiner to generate the oscillator control signal.

5. The apparatus of claim 3, wherein the recovery block in each channel block comprises:
a phase rotator configured to rotate the phase of the global signal based on a rotation control signal to generate the clock signal for the respective data channel; and
a rotation controller configured to generate the rotation control signal based on the clock signal fed by the phase rotator and the respective data signal.

6. The apparatus of claim 5, wherein the rotation controller in each channel block comprises:
a phase detector for generating a signal representing a phase difference between the clock signal fed by the phase rotator and the respective data signal; and
a filter for filtering the signal representing the phase difference to generate the rotation control signal.

7. A clock recovery apparatus for a plurality of data channels, the apparatus comprising:
a plurality of channel blocks, each channel block comprising:
a frequency detection block configured to generate an intermediate signal based on a respective data signal received from a respective data channel and a global signal; and
a recovery block configured to recover a clock signal for the respective data channel in response to the respective data signal and the global signal; and
a global signal generation block configured to receive and combine the intermediate signals from the plurality of channel blocks to generate the global signal,
wherein the frequency detection block in each channel block is configured to generate the intermediate signal based on the respective data signal, the global signal, and the recovered clock signal for the respective data channel, and
wherein the frequency detection block in each channel block comprises:
a reference signal generator configured to generate a reference signal based on the respective data signal and the recovered clock signal for the respective data channel;
a feedback signal generator configured to generate a feedback signal based on the global signal; and
a frequency detector configured to generate the intermediate signal representing a frequency difference between the reference signal and the feedback signal.

8. The apparatus of claim 7, wherein:
the reference signal generator in each channel block is configured to divide the frequency of the respective data signal to generate the reference signal,
the feedback signal generator in each channel block comprises a frequency divider for dividing the frequency of the global clock signal to generate the feedback signal, and
a division ratio used by the reference signal generator in each channel block is controlled based on the recovered clock signal for the respective data channel.

9. A clock recovery apparatus for a plurality of data channels, the apparatus comprising:
a frequency acquisition block configured to receive data signals from a plurality of data channels and generate a global signal based on at least one data signal received from one or more active channels of the plurality of data channels, wherein the global signal has a frequency substantially same as the frequency used by the one or more active channels; and
a plurality of recovery blocks corresponding respectively to the plurality of data channels, each of the plurality of recovery blocks being configured to recover a clock signal for a corresponding data signal by rotating the phase of the global signal based on the corresponding data signal,
wherein the frequency acquisition block comprises:
a plurality of frequency detection blocks corresponding respectively to the plurality of data channels, each of the plurality of frequency detection blocks being configured to process a corresponding data signal with the global signal to output an intermediate signal; and
a global signal generation block configured to combine the intermediate signals from the frequency detection blocks to generate the global signal, and
wherein each of the plurality of frequency detection blocks comprises:
a reference signal generator configured to generate a reference signal based on a corresponding data signal;
a feedback signal generator configured to generate a feedback signal based on the global signal; and
a frequency detector configured to generate the intermediate signal representing a frequency difference between the reference signal and the feedback signal.

10. The apparatus of claim 9, wherein the global signal generation block comprises
an oscillator controller configured to combine the intermediate signals to generate an oscillator control signal; and
an oscillator configured to generate the global clock signal based on the oscillator control signal.

11. The apparatus of claim 9, wherein each of the recovery blocks comprises:
a phase rotator configured to rotate the phase of the global signal according to a rotation control signal to generate the clock signal; and
a rotation controller configured to generate the rotation control signal based on the clock signal fed by the phase rotator and a corresponding data signal.

12. A clock recovery apparatus for a plurality of data channels, the apparatus comprising:
a frequency acquisition block configured to receive data signals from a plurality of data channels and generate a global signal based on at least one data signal received from one or more active channels of the plurality of data channels, wherein the global signal has a frequency substantially same as the frequency used by the one or more active channels; and
a plurality of recovery blocks corresponding respectively to the plurality of data channels, each of the plurality of recovery blocks being configured to recover a clock signal for a corresponding data signal by rotating the phase of the global signal based on the corresponding data signal;
wherein the frequency acquisition block is configured to receive the recovered clock signals from the recovery blocks and generate the global signal based on the data signals, the global signal, and the recovered clock signals,
wherein the frequency acquisition block comprises:
a plurality of frequency detection blocks corresponding respectively to the plurality of data channels, each frequency detection block being configured to process a corresponding data signal with the global signal and the recovered clock signal for a corresponding data channel to output an intermediate signal; and a global signal generation block configured to combine the intermediate signals from the frequency detection blocks to generate the global signal, wherein each of the frequency detection blocks comprises:
  a reference signal generator configured to generate a reference signal based on a corresponding data signal and the recovered clock signal for a corresponding data channel;
  a feedback signal generator configured to generate a feedback signal based on the global signal; and
  a frequency detector configured to generate the intermediate signal representing a frequency difference between the reference signal and the feedback signal.

* * * * *